(12) United States Patent
Faralli et al.

(10) Patent No.: US 9,469,109 B2
(45) Date of Patent: Oct. 18, 2016

(54) MICROFLUID DELIVERY DEVICE AND METHOD FOR MANUFACTURING THE SAME

(71) Applicant: STMicroelectronics S.r.l., Agrate Brianza (IT)

(72) Inventors: Dino Faralli, Milan (IT); Laura Maria Castoldi, Abbiategrasso (IT); Paolo Ferrari, Gallarate (IT); Marta Carminati, Casatenovo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/531,830

(22) Filed: Nov. 3, 2014

(65) Prior Publication Data

US 2016/0121607 A1    May 5, 2016

(51) Int. Cl.
*B41J 2/14* (2006.01)
*B41J 2/16* (2006.01)

(52) U.S. Cl.
CPC .............. *B41J 2/1433* (2013.01); *B41J 2/162* (2013.01); *B41J 2/1623* (2013.01); *B41J 2/1626* (2013.01)

(58) Field of Classification Search
CPC ...... B41J 2/1433; B41J 2/1623; B41J 2/162; B41J 2/1626; B41J 2002/14475
USPC .......... 347/20, 40–45, 47, 54–56, 59, 62–64
See application file for complete search history.

(56) References Cited

U.S. PATENT DOCUMENTS

| 6,455,112 | B1 | 9/2002 | Ohkuma et al. | |
| 7,905,578 | B2 * | 3/2011 | Nishi | B41J 2/14314 347/47 |
| 2004/0027424 | A1 * | 2/2004 | Kim | B41J 2/1603 347/64 |

* cited by examiner

*Primary Examiner* — Kristal Feggins
(74) *Attorney, Agent, or Firm* — Seed Intellectual Property Law Group PLLC

(57) ABSTRACT

Embodiments disclose herein are directed to a microfluidic delivery device that has a predominantly semiconductor structure, such as silicon. In particular, the structure for delivering fluid may be formed from polycrystalline silicon, also called polysilicon, or epitaxial silicon. The microfluidic delivery device that predominantly uses silicon based materials to form the structures that are in contact with the dispensed fluid results in a device that is compatible with a wide set of fluids and applications.

21 Claims, 5 Drawing Sheets

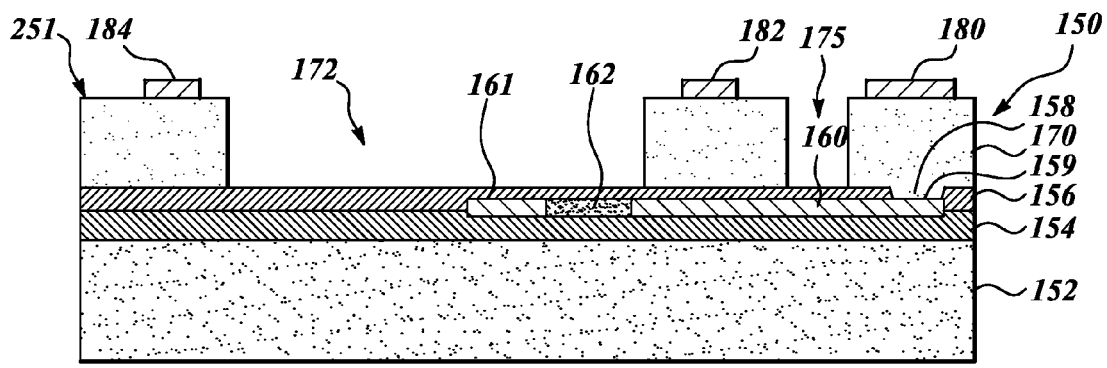
Fig.2D
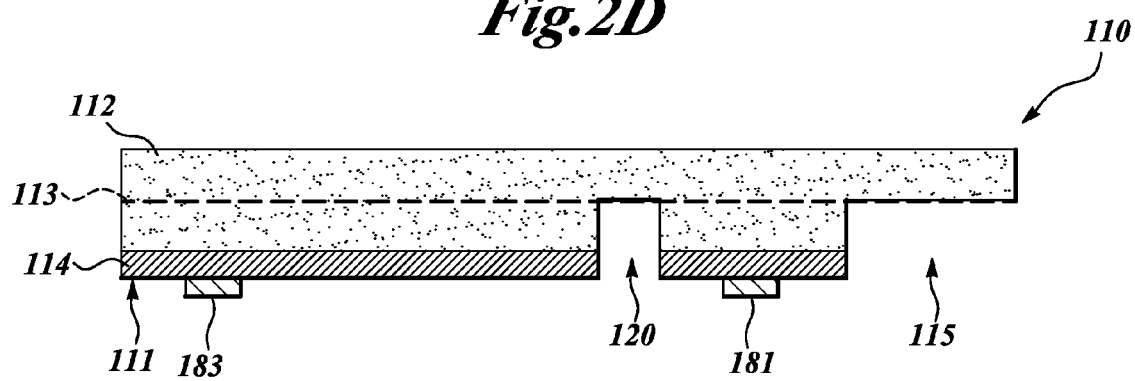
Fig.2E
Fig.2F

MICROFLUID DELIVERY DEVICE AND METHOD FOR MANUFACTURING THE SAME

BACKGROUND

1. Technical Field

Embodiments are directed to microfluidic delivery devices and methods of making the same.

2. Description of the Related Art

Microfluidic delivery devices are generally used in liquid dispensing applications, such as dispensing ink in ink-jet printers. A microfluidic delivery system can include fluid holding structures, such as a reservoir, and delivery structures, such as the microfluidic delivery device. Both the fluid holding structures and the delivery structures are in direct contact with the fluid for dispensing. These structures are typically made from organic materials, including polymers.

Many inks or other fluids are incompatible with these polymer materials. Using incompatible inks and other fluids, particularly organic fluids, in a polymer-based microfluidic delivery device can cause premature damage to, and can reduce the useful life of, such devices. For example, an organic fluid can etch the polymer structure and change the dimensions of the delivery device. This may cause the delivery device's efficiency and accuracy to degrade over time. In addition, the fluids may react with the polymer structure, weakening or otherwise damaging the structure. The fluid may also pick up contaminants from the polymer structure which may have undesirable effects on the fluid.

BRIEF SUMMARY

One or more embodiments disclose herein are directed to a microfluidic delivery device that includes structures that have compatibility with a wide group of fluids. In some embodiments, the microfluidic delivery devices are designed so that organic polymers do not come into contact with the dispensed fluids.

One embodiment is directed to a microfluidic delivery device that has a predominantly semiconductor structure, such as silicon. In particular, the structure for delivering fluid may be formed from polycrystalline silicon, also called polysilicon, or epitaxial silicon. The microfluidic delivery device that predominantly uses silicon based materials to form the structures that are in contact with the dispensed fluid results in a device that is compatible with a wide set of fluids and applications.

In one embodiment, the fluidic delivery device is constructed in first and second parts. The first part may include a fluid inlet, a heater, and a bottom and sidewalls of a fluid chamber. The first part may further include electrical contacts formed from poly tungsten silicide sandwiched between two layers of dielectric material. The heater, contacts, and dielectric material may be formed in or on a first semiconductor wafer base material, such as silicon.

In one embodiment, an epitaxial silicon layer may be grown atop the dielectric material. The fluid chamber is formed in the epitaxial silicon layer and the chamber inlet is formed in the silicon wafer using standard semiconductor processing techniques, including lithography and etching processes.

A second part of the fluidic delivery device may include a top of the fluid chamber and a nozzle that are formed in a second semiconductor wafer, such as silicon. The first and second parts are bonded together to form a stacked assembly that includes a plurality of fluidic delivery devices. The stacked assembly is then diced to form individual fluid delivery devices.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIGS. 2A-2I are schematics of the fluid chamber of FIG. 1 at different stages in a manufacturing process according to one embodiment of the present disclosure.

DETAILED DESCRIPTION

Figure 1:
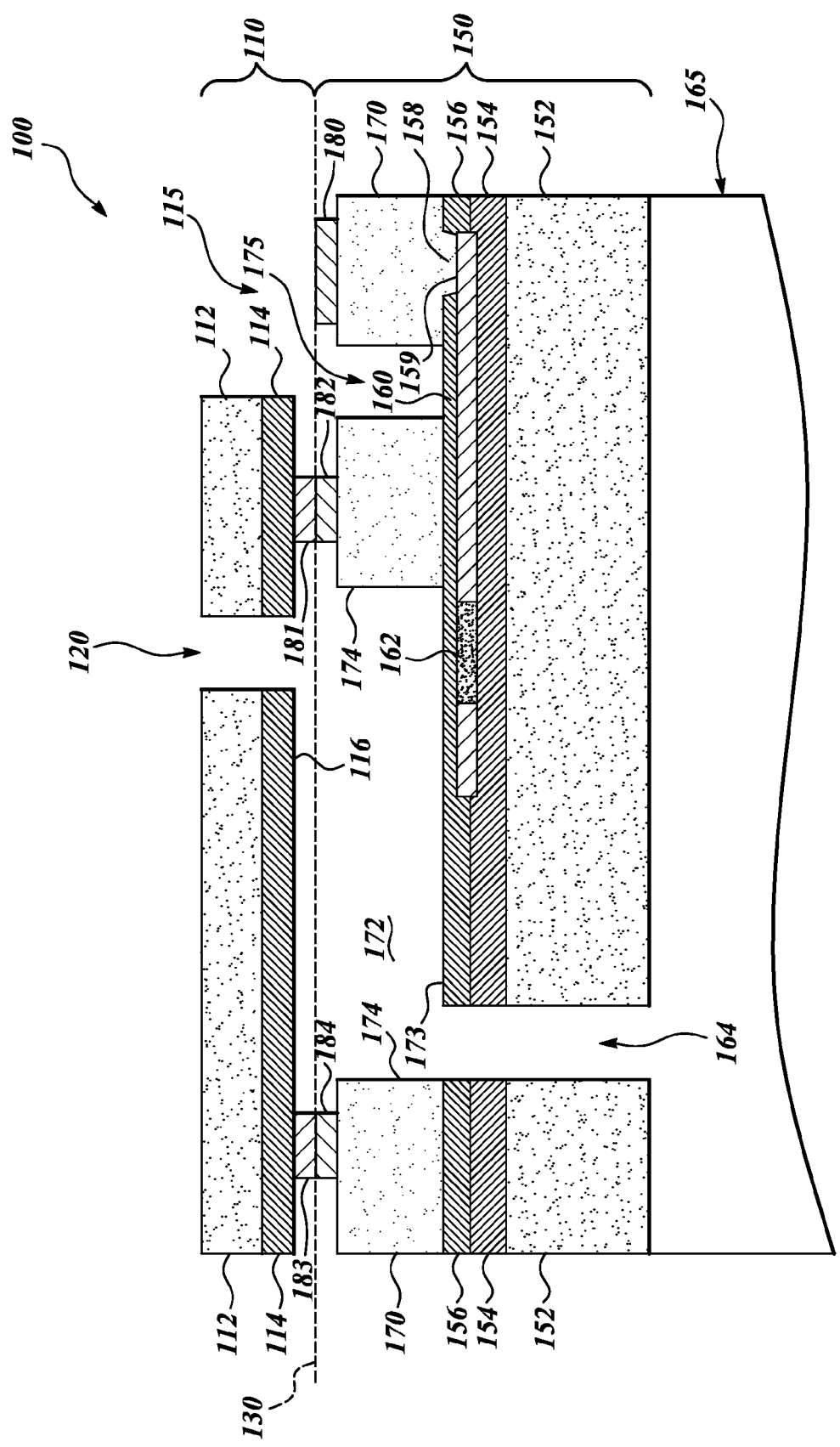
FIG. 1 is a schematic cross section of a fluid chamber according to one embodiment of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components, semiconductor fabrication, and MEMS fabrication have not been described in detail to avoid unnecessarily obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

In the drawings, identical reference numbers identify similar elements or acts. The size and relative positions of elements in the drawings are not necessarily drawn to scale.

Referring to FIG. 1, a microfluidic delivery device 100 is illustrated. Generally described, the microfluidic delivery device 100 is configured to receive fluid from a fluid reservoir 165 and dispense or expel a small volume of the received fluid. Any fluid may be used in the microfluidic delivery device 100 including but not limited to ink, perfumes, medical fluids, and any other dispensable fluid. One use of such a delivery device is inkjet printer heads. Other potential uses include nebulizers for perfumes and for medical applications, such as an inhaler, and other liquid dispensing applications.

The microfluidic delivery device 100 includes a nozzle plate 110 and a chamber body 150. The nozzle plate 110 includes a substrate layer 112, which may be formed from a silicon wafer or glass, and a dielectric layer 114 which may be an oxide deposition, such as silicon oxide. The nozzle plate 110 also includes a nozzle 120 and pad access opening 115, both formed as openings that extend through the nozzle plate 110.

The chamber body 150 includes a silicon substrate 152. First and second dielectric layers 154, 156 are located on the silicon substrate 152. The first and second dielectric layers 154, 156 may include silicon oxide.

The chamber body 150 further includes a conductive interconnection component 160 that, in one embodiment, is a buried polysilicon runner. The conductive interconnect component 160, that is coupled to a heater component 162, that in one embodiment is a non-silicided polysilicon. The heater component 162 is disposed between the first dielectric layer 154 and the second dielectric layer 156 below the nozzle.

The second dielectric layer 156 has an opening 158 in at least one location to provide an electrical conduction path there through to the conductive interconnect component 160 and the heater component 162. At the opening 158 is an electrical contact 159 to the conductive interconnect component 160.

An epitaxial silicon growth layer 170 that formed on top of the second dielectric layer 156. In that regard, a silicon on insulator (SOI) structure is formed. A fluid chamber 172 is located above the second dielectric layer 153 with sidewalls delimited by the epitaxial silicon growth layer 170. Side surfaces 174 of the fluid chamber 172 are formed in the epitaxial silicon growth layer 170.

A bottom surface of the chamber body 150 includes a fluid inlet 164 coupled to the reservoir 165. The fluid inlet 164 is in fluid communication with the fluid chamber 172 and the fluid reservoir 165. In that regard, the fluid inlet 164 places the reservoir 165 in fluid communication with the fluid chamber 172.

The fluid inlet 164 is a through opening that extends through the silicon substrate layer 152 and the first and second dielectric layers 154, 156. The chamber body 150 may also include a trench 175 in the epitaxial layer 170. The trench 175 may assist in electrically isolating the bonding pad 180 and the electrically conductive path through the epitaxial layer 170 and the interconnection component 160 to the heater component 162 from the structure surrounding the fluid chamber 172.

On top of the epitaxial silicon growth layer 170, are bonding rings 182, 184 and bonding pad 180. The bonding pad 180 is a conductive layer as is well known in the art. The bonding pad may be configured to receive a conductive wire for providing electrical coupling outside of the device 100. The bonding pad 180 provides electrical communication to the heater component 162 through the epitaxial layer 170 and the interconnection component 160.

The nozzle plate 110 and the chamber body 150 are bonded to each other by one or more bonding layers with a fluid tight seal. In particular, nozzle bonding rings 181, 183 located on the dielectric layer 114 are bonded to chamber bonding rings 182, 184 located on the epitaxial layer 170. In some embodiments, the bonding rings 181, 182, 183, 184 are gold layers, and the bond between the pads is created though a thermocompression process, discussed in more detail below.

The nozzle plate 110 forms an upper surface for the fluid chamber 172. When the chamber body 150 and nozzle plate 110 are bonded together to form the microfluidic device 100, the fluid chamber 172 is in fluid communication with an environment external to the device 100 through the nozzle 120 of the nozzle plate 110.

As discussed above, the sidewalls of fluid chamber 172 are formed predominantly in the epitaxial layer 170. The bottom surface 173 of the fluid chamber 172 is the top surface of the dielectric layer 156. The fluid chamber sidewalls 174 may also comprise the bonding rings 181, 182, 183, 184. The top surface of the chamber 116 is the bottom surface of the dielectric layer 114 of the nozzle plate 110. In one embodiment, the fluid chamber 172 has a depth of 10-50 microns from the top surface 116 to the bottom surface 173.

Although the fluid chamber 172 is formed predominantly in the epitaxial layer 170, it is to be appreciated that the fluid chamber may be formed in other types of semiconductor layers.

The heater component 162 is located adjacent the chamber bottom 173 below the nozzle 120 and is configured to heat the fluid within the fluid chamber 172. By heating the fluid, the heater component 162 causes fluid in the fluid chamber 172 to be ejected through the nozzle 120 into the external environment. In particular, the heater component 162 vaporizes the fluid to create a bubble. The expansion that creates the bubble causes a droplet to form and eject from the nozzle 120.

The size and location of heater component 162 can be selected based on desired performance properties of the device. In some embodiments, the heater component 162 is located at the bottom surface of the fluid chamber opposite and beneath the nozzle 120. Specific details of the formation of the nozzle plate 110, the chamber body 150 and their combination into the microfluidic device 100 will be discussed in more detail below.

As discussed above, one of the potential uses for the microfluidic device 100 is in medical applications. The fluids associated with medical applications are wide-ranging and include organic fluids, inorganic fluids, and various fluids that may have a diverse range of chemical and reactive properties. The materials used to form the microfluidic device 100, and in particular the materials used to form the portions of the microfluidic device 100 that contact the fluid, do not contain organic polymers and are compatible with a wide set of fluids. For example, in some embodiments, the wafers or substrate layers 112, 152 are made from silicon or glass, the dielectric layers 154, 156, 114 are silicon oxides, the rings 181, 182, 183, 184 are gold, and the epitaxial layer 170 is epitaxial polysilicon. All of these materials are compatible with a wide range of fluids, including organic fluids.

FIGS. 2A-2I illustrate stages of a process to form the microfluidic device in FIG. 1, according to one embodiment of the present disclosure. The formation of the chamber body is detailed in FIGS. 2A-2D, the formation of the nozzle plate is discussed with reference to FIG. 2D, and the bonding of the nozzle plate and the chamber body to form a microfluidic device is discussed with reference to FIGS. 2F-2I.

Figure 2A:
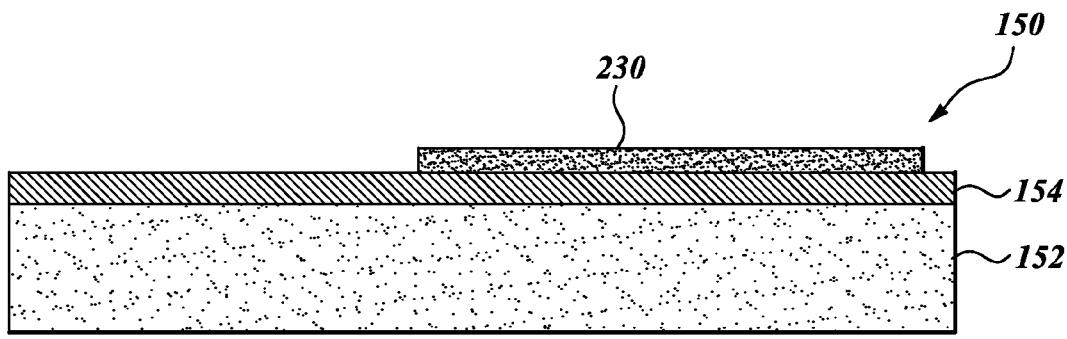
Figure 2B:
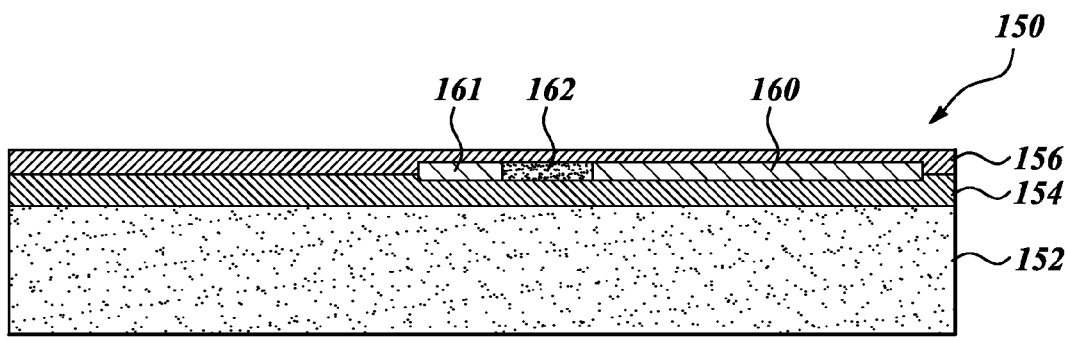

With reference to FIG. 2A, a chamber body 150 is shown in an incomplete state. The chamber body includes a substrate layer 152, which may be semiconductor material, such as silicon. The substrate layer 152 can also be doped with a desired conductivity type, either P-type or N-type. In one embodiment, the substrate layer 152 is approximately 700 microns thick.

A first dielectric layer 154 is formed on the substrate layer 152. The first dielectric layer 154 may be formed using any deposition method. In one embodiment, the dielectric layer is formed using thermal oxidation and the dielectric layer comprises silicon oxide, such as dioxide. The first dielectric layer 154 may also be carbide or other inert dielectric material.

A first conductive layer 230 is deposited on a portion of the first dielectric layer 154. The first conductive layer 230 may have a width that is approximately the same as the diameter of a nozzle, such as the nozzle 120 of FIG. 2H, in one embodiment. The first conductive layer 230 may have a thickness between approximately 0.2 and 1 micron. In some embodiments, such as the embodiment shown in FIG. 2A, the first conductive layer 230 has a thickness between 0.4 microns to 100 nm. The first conductive layer 230 can be formed using chemical vapor deposition. In some embodiments, the first conductive layer 230 is formed using low-pressure chemical vapor deposition. The first conductive layer 230 or a portion thereof forms the heater component 162.

In one embodiment the first conductive layer 230 is polysilicon. Polysilicon has a relatively high sheet resistance, Rs, such that it resists the flow of electrical current as compared to a low sheet resistance material. In that regard, in one embodiment, the heater component 162 is polysilicon. When electrical current flows through the relatively high resistance of the polysilicon of the heater component 162, heat is generated.

In some embodiments, it may be undesirable for the entire first conductive layer 230 to act as a heater. Therefore, a non-heater portion of the first conductive layer 230 is changed into a silicide via silicidation and forms the conductive interconnect component 160 for carrying electrical current to the heater component 162. In that regard, the conductive interconnect component 160 has low resistivity, while the heating component 162 has high resistivity.

In one embodiment, the conductive interconnect component 160 are subject to silicidation, such as tungsten or titanium silicidation. In the embodiment shown in FIG. 2B, the conductive interconnect component 160 is poly tungsten silicide.

In this way, the conductive interconnect component 160 facilitates electrical current flow from the bonding pad 180, see FIG. 2D, and through the heater component 162.

A second dielectric layer 156 is formed over the first dielectric layer 154, the heater component 162, and the conductive interconnect component 160, thereby insulating heater component 162 and the conductive interconnect component 160. The second dielectric layer 156 may be formed using any deposition method. In one embodiment, the second dielectric layer 156 is formed using low-pressure chemical vapor deposition. The second dielectric layer 156 may also be carbide or other inert dielectric material.

Figure 2C:
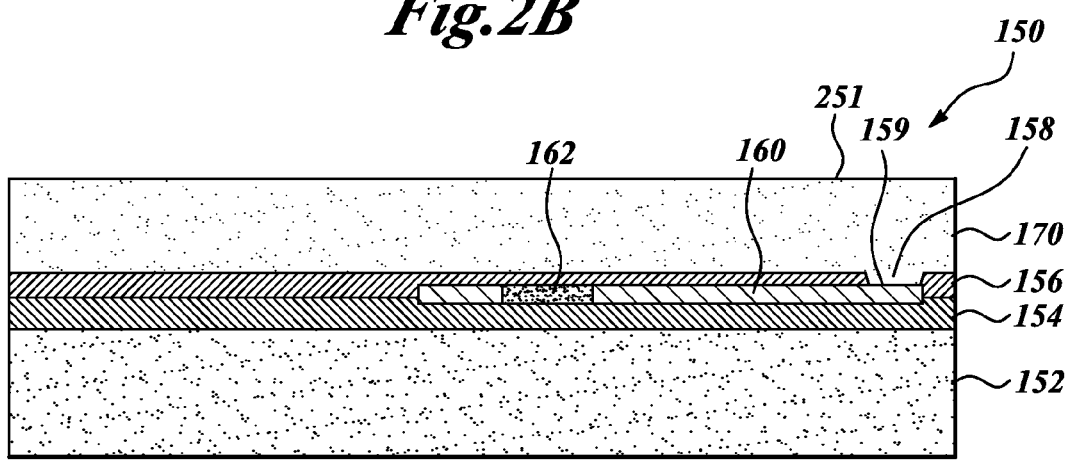

Referring now to FIG. 2C, an opening is formed through the second dielectric layer 156, exposing the contact 159. Various methods of forming the opening through the second dielectric layer 156 may be used include etching steps, which may include dry etching and/or wet etching or partial deposition of the second dielectric. In an alternative embodiment, the second dielectric layer 156 is deposited with the opening 158.

An epitaxial silicon growth layer is formed over the second dielectric layer 156 and in contact with the contact 159. The epitaxial silicon growth layer 170 of FIG. 2C is a crystalline layer of silicon, for example polysilicon. The epitaxial silicon growth layer 170 may be 10 to 50 microns thick, preferably approximately 15 microns thick.

After the epitaxial silicon growth layer 170 is formed, it may be subjected to a planarization step. The planarization steps planarizes the upper surface 171 of the epitaxial silicon growth layer 170 forming a substantially flat plane. A planar upper surface 171 of the silicon growth layer 170 facilitates the bonding of the chamber body 150 with the nozzle plate; see, e.g., FIG. 2F. Any known method of planarization of epitaxial silicon may be used. In one embodiment, a chemical-mechanical-polishing process, known as a CMP process, may be used to planarize the upper surface 171 of the epitaxial silicon growth layer 170 into a substantially flat plane. Using the CMP process, the upper surface 171 of the epitaxial silicon growth layer 170 is planarized by rotating the upper surface 171 of the epitaxial silicon growth layer 170, and by extension, the whole chamber body 150, under pressure against a polishing pad in the presence of a silica-based alkaline slurry.

With reference to FIG. 2D, the bonding rings 182, 184 and the electrical bonding pad 180 are formed on the upper surface 171 of the epitaxial silicon growth layer 170. The bonding rings 182, 184 and the bonding pad 180 may include a barrier layer, a seed layer, and a gold electroplated layer.

The nitrides of refractory metals, such as titanium, tantalum, and tungsten, may be used in the barrier layer to prevent diffusion between the epitaxial silicon growth layer 170 and the bonding rings 182, 184 and the bonding pad 180 materials. The seed layer acts to provide a structure for the gold electroplating layer to seed or adhere on. The seed layer may be a mesh layer formed through electron-beam evaporation, low-pressure chemical vapor deposition, or other methods. After the seed layer is formed on the barrier layer, a gold layer may be electroplated onto the chamber body 150 to finalize the bonding rings 182, 184 and the bonding pad 180.

The fluid chamber 172 and a trench 175 are formed in the epitaxial silicon growth layer 170 by etching or other acceptable semiconductor processing techniques. Known etching techniques, including wet etching, dry etching, or a combination of wet and dry etching, are controllable and suitable for etching the fluid chamber 172. The depth of the etching is through the entire depth of the epitaxial silicon growth layer 170.

With reference to FIG. 2E, the formation of the nozzle plate 110 is shown and discussed. As with the chamber body 150, the nozzle plate 110 includes a substrate layer 112. The substrate layer may be any substrate material, such as a semiconductor substrate or glass. In some embodiments, the substrate layer 112 is between approximately 100 and approximately 800 microns thick.

A dielectric layer 114 is formed on the substrate layer 112. The dielectric layer 114 may be formed using any may be formed using any deposition method for forming oxidizing silicon substrates that results in a dielectric layer that is compatible with the fluids to be used in the microfluidic device. In this embodiment, the dielectric layer is formed using thermal oxidation and the dielectric layer comprises silicon dioxide. The dielectric layer 114 may also be carbide or other inert dielectric material.

The bonding rings 181, 183 are formed on the lower surface 111 of the dielectric layer 114. The bonding rings 182, 184 are formed of a barrier layer, a seed layer, and an electroplated gold layer.

The nozzle 120 is formed through the dielectric layer 114 and at least partially though the substrate layer 112 by etching or other acceptable semiconductor processing technique. Known etching techniques, including wet etching, dry etching, or a combination of wet and dry etching, are controllable and suitable for etching the nozzle 120 in the dielectric layer 114 and the substrate layer 112.

Figure 2G:
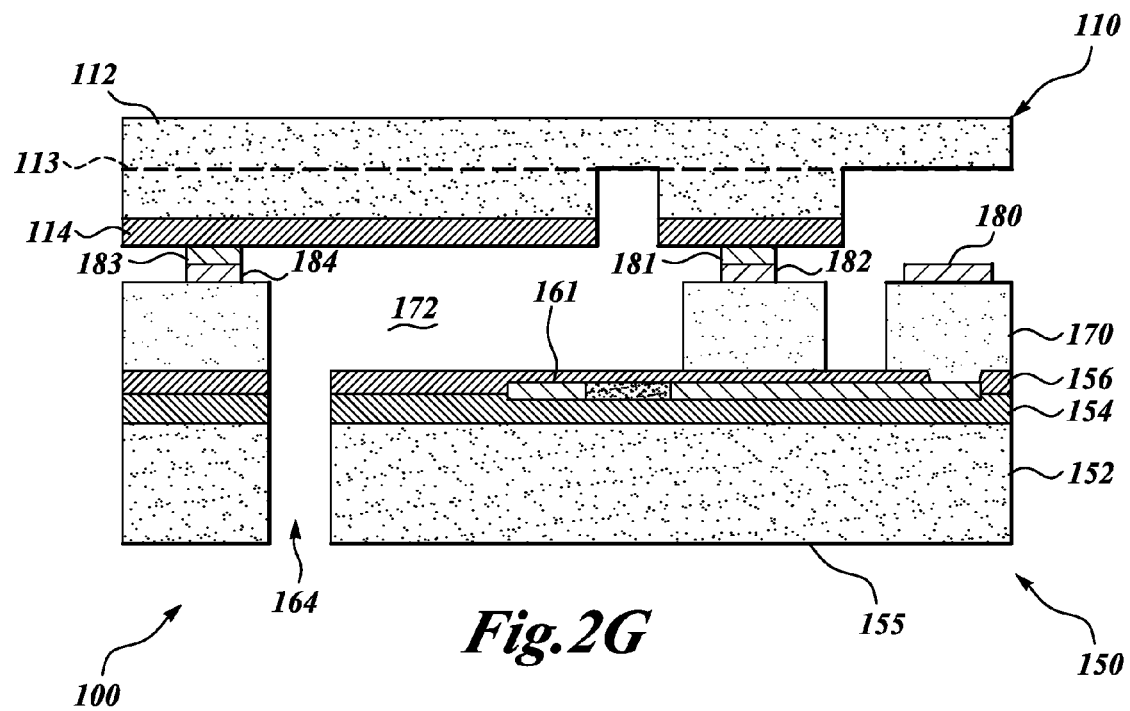
Figure 2H:
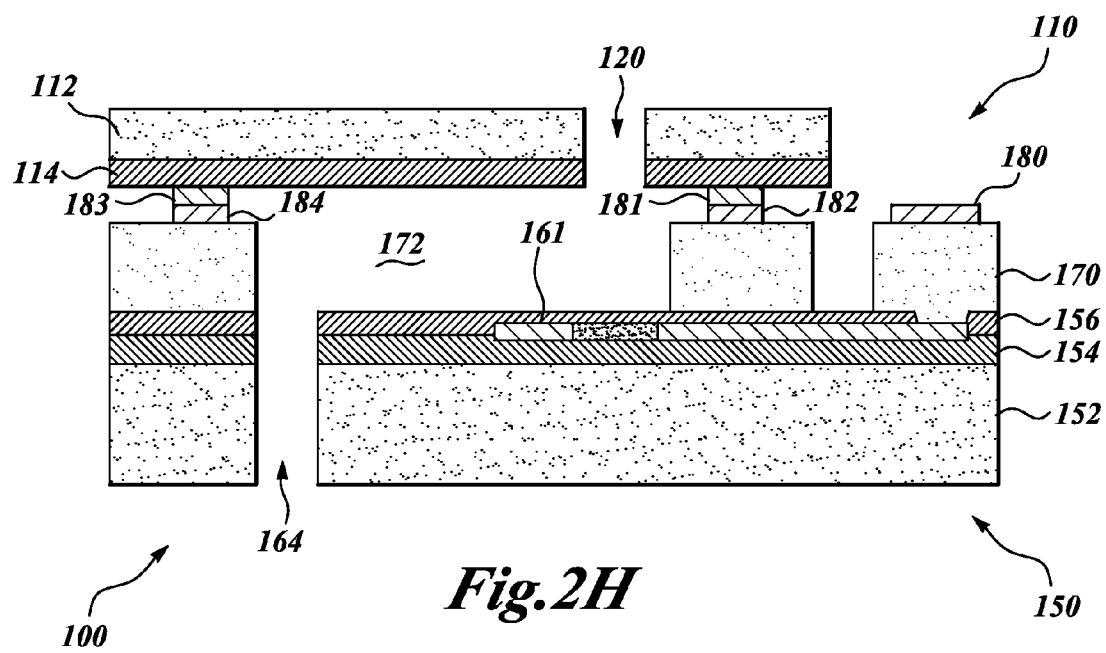

An area for accessing the pad 180 of the assembled microfluidic device 100, see FIGS. 2F-2H, may also be etched into the nozzle plate 110. For example, pad access 115 is formed through the dielectric layer 114 and at least partially though the substrate layer 112 by wet and/or dry etching or other acceptable semiconductor processing techniques.

Optionally, the substrate layer 112 of the nozzle plate 110 may be a silicon on insulator-like wafer with a buried oxide layer 113. The buried oxide layer 113 is surrounded on both sides by silicon layers. The silicon on insulator-like structure may provide for a more precise shaping of the nozzle. In an embodiment with the buried oxide layer 113, the nozzle 120 may be formed through the dielectric layer 114 and at least partially though the substrate layer 112 to the buried oxide layer 113.

Referring now to FIG. 2F, the bonding of the nozzle plate 110 and chamber body 150 is depicted. The nozzle plate 110 and chamber body 150 are bonded through the nozzle plate 110 bonding rings 181, 183 and respective chamber body 150 bonding rings 182, 184.

In embodiments with gold bonding rings 182, 184, 181, 183, the nozzle plate 110 and chamber body 150 may be bonded together using a thermal compression bonding method. In such a method, the nozzle plate 110 and chamber body 150 are compressed together under high heat to bond the respective gold bonding rings 182, 184, 181, 183 together. Although gold bonding rings and thermal compression is the preferred method of bonding the nozzle plate 110 and chamber body 150 together, any other acceptable bonding structures and methods may be used.

With the nozzle plate 110 and chamber body 150 bonded together, the fluid chamber 172 is complete. The bottom of the fluid chamber 172 is bounded by the upper surface of the second dielectric layer 156. The top of the fluid chamber 172 is bounded by the lower surface of the dielectric layer 114 of the nozzle plate 110. The sides of the fluid chamber 172 are bounded by the epitaxial silicon growth layer 170 and the bonding rings 182, 184, 181, 183.

Referring now to FIG. 2G, an embodiment of the fluid inlet formation and backside grinding of the microfluidic device 100 is shown. The backside 155 of the microfluidic device 100 is ground using a mechanical grinding process to achieve a uniform surface and to reduce the overall thickness of the microfluidic device 100.

After grinding the backside 155, the fluid inlet 164 may be formed. The fluid inlet 164 is formed through the substrate layer 152 and the first and second dielectric layers 154, 156 to connect a fluid reservoir 165, not shown, with the fluid chamber 172. Known methods of forming the fluid inlet 164 through the substrate layer 152 and the first and second dielectric layers 154, 156 include etching steps, such as dry etching or wet etching, wherein the pattern of the second dielectric layer 156 that is not etched is masked off and then the path to form the contact 159 is etched. In a preferred embodiment, the fluid inlet 164 is formed through the substrate layer 152 and the first and second dielectric layers 154, 156 using a deep reactive-ion etching process. The deep reactive-ion etching process is well-suited for creating deep and high aspect ratio features in substrates, such as the formation of the fluid inlet 164.

Referring now to FIG. 2H, an embodiment for front side grinding and etching for the buried oxide layer of the microfluidic device 100 is shown. The starting thickness of the substrate layer 112 may be between 100 and 800 microns. In some embodiments, the substrate layer 112 thickness is reduced to between approximately 10 and approximately 100 microns.

In embodiments wherein the substrate layer 112 does not include the buried oxide layer 113, then the substrate layer 112 may be ground using a mechanical grinding process to achieve a uniform surface and to reduce the overall thickness of the substrate layer 112 and, in turn, the microfluidic device 100. The grinding of substrate layer 112 may be carried out until the nozzle 120 passes through the remaining thickness of the substrate layer 112 and connects the fluid chamber 172 in fluid communication with the external environment.

In embodiments wherein the substrate layer 112 includes the buried oxide layer 113, the substrate layer 112 may be ground to the buried oxide layer 113 using a mechanical grinding process. After grinding the substrate layer 112 to the buried oxide layer, the buried oxide layer 113 may be removed through an etching process to open the outlet of the nozzle 120 such that the nozzle 120 connects the fluid chamber 172 in fluid communication with the external environment. Known etching techniques for etching the buried oxide layer 113, include wet etching, dry etching, or a combination of wet and dry etching. In some embodiments, the buried oxide layer 113 may be blanket etched such that the entire buried oxide layer 113 is removed, or the buried oxide layer 113 may be masked such that only the buried oxide layer 113 at the nozzle 120 is etched.

With the opening of the nozzle 120 to connect the fluid chamber 172 to the external environment, the structure of the microfluidic device 100 is complete. The fluid inlet 164 connects a fluid reservoir to the fluid chamber 172 to provide a source of fluid to the microfluidic device 100, the nozzle 120 connects the fluid chamber 172 to the outside environment, and the heater 162 produces the energy that forces the fluid from the fluid chamber 172, through the nozzle 120, and out into the external environment.

In some embodiments, the single microfluidic device 100 is just one of many microfluidic devices formed at a single time. A nozzle plate 110 may include numerous nozzles 120 and other structural elements in an array, while the chamber body 150 may include numerous fluid chambers 172, heaters 162, fluid inlets 164, and other structural elements in a corresponding array. When bonded together, such a nozzle plate and chamber body may create a plurality of microfluidic devices 100. For example, FIG. 2I depicts two such microfluidic devices 100a, 100b, joined together in a single, repeating structure.

Figure 2I:
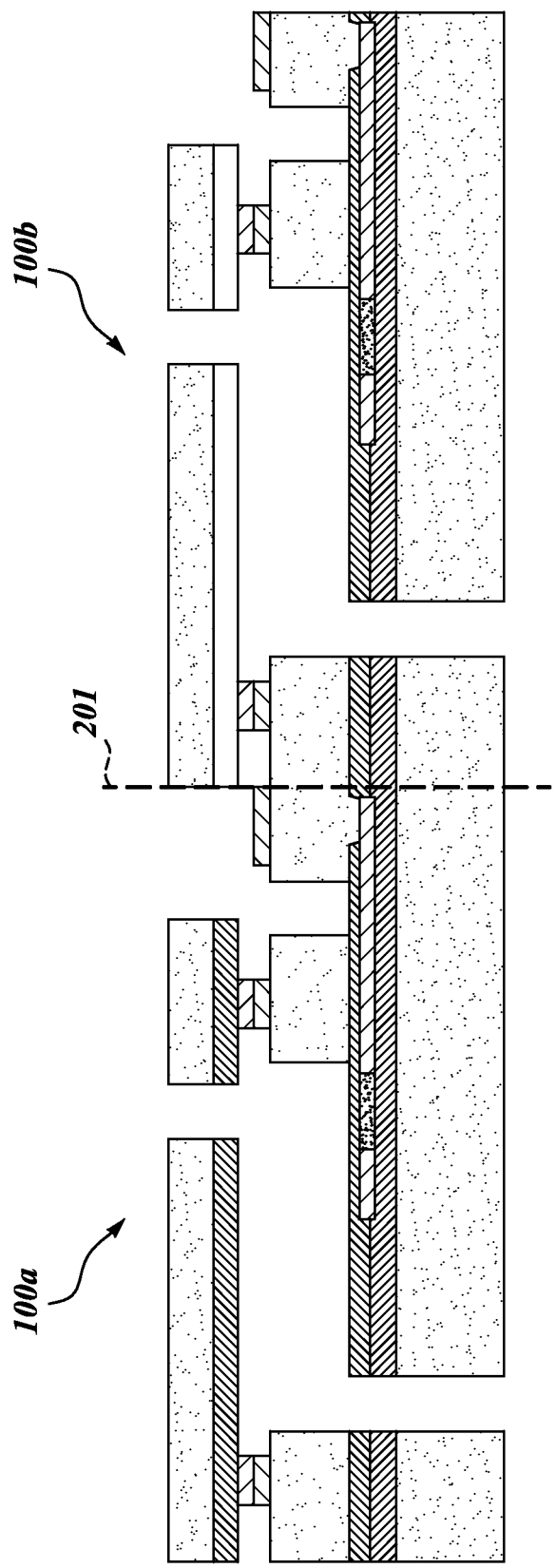

As shown in FIG. 2I, the two microfluidic devices 100a, 100b may be separated, or diced, along the line 201. The dicing process may include scribing and breaking, whereby the front or back side of the microfluidic devices 100a, 100b are scribed to create a weak line, and then a bending force causes the microfluidic devices to break and separate. The dicing process may also include mechanical sawing whereby a dicing saw is used to cut the microfluidic devices 100a, 100b along the line 201, or may include laser cutting whereby a laser is used to separate the microfluidic devices 100a, 100b along the line 201 and into individual microfluidic devices 100a, 100b.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A microfluidic device comprising:
   a nozzle plate including a dielectric layer, a substrate layer, and a nozzle;

a chamber body, the chamber body including a semiconductor substrate, a dielectric layer over the semiconductor substrate, and a semiconductor layer over the dielectric layer, the semiconductor layer being a layer of epitaxial polysilicon and the semiconductor substrate being a silicon substrate;
a chamber at least partially formed in the semiconductor layer and covered by the nozzle plate, the chamber in fluid communication with the nozzle; and
a fluid inlet comprising an aperture through the chamber body and in fluid communication with the chamber.

2. The microfluidic device of claim 1 wherein:
the chamber is formed by a top, a bottom, and sidewalls;
the top of the chamber is formed by a surface of the dielectric layer of nozzle plate, the bottom of the chamber is formed by a surface of the chamber dielectric layer; and
at least a portion of the sidewalls is formed by a portion of the semiconductor layer.

3. The microfluidic device of claim 1 wherein the dielectric layer of the nozzle plate and the dielectric layer of the chamber body include silicon dioxide.

4. The microfluidic device of claim 1 wherein the dielectric layer of the chamber body includes a lower dialectic layer and an upper dielectric layer, and a buried silicon runner therebetween, the buried silicon runner including a heating portion and an interconnection portion.

5. The microfluidic device of claim 4 wherein the heating portion is a polysilicon material and the interconnection portion is a silicide material.

6. The microfluidic device of claim 1, further comprising:
a bonding pad;
a heater; and
a trench in the chamber body that electrically isolates the boding pad from the chamber body.

7. The microfluidic device of claim 6 wherein the nozzle plate includes a pad access structure above the electrical bonding pad.

8. The microfluidic device of claim 1 further comprising:
a chamber body bonding ring formed on an upper surface of the semiconductor layer of the chamber body; and
a nozzle plate bonding ring formed on a lower surface of the dielectric layer of the nozzle plate, the chamber body bonding ring bonded to the nozzle plate bonding ring.

9. A microfluidic device comprising:
a nozzle plate including a dielectric layer, a substrate layer, and a nozzle, the dielectric layer located on a surface of the substrate layer;
a chamber body including a silicon substrate, a dielectric layer over the silicon substrate, and a silicon layer over the dielectric layer, the chamber body including an opening in the silicon layer, wherein the chamber body is coupled to the nozzle plate;
a chamber defined by the opening in the chamber body and the nozzle plate, the chamber being configured to hold a fluid; and
a fluid inlet delimited by an opening through the chamber body, the nozzle being in fluid communication with the fluid inlet through the chamber.

10. The microfluidic device of claim 9, further comprising a heater component in the chamber body, the heater component configured to heat the fluid in the chamber to expel fluid through the nozzle.

11. The microfluidic device of claim 10, wherein the heater component is facing the nozzle.

12. The microfluidic device of claim 9, wherein the chamber body is coupled to the nozzle plate by metallic bonding pads.

13. A microfluidic device comprising:
a fluid reservoir having an interior configured to contain fluid; and
a microfluidic delivery device mechanically coupled to the fluid reservoir and including:
a nozzle plate including a nozzle having an opening extending through the nozzle plate;
a chamber body coupled to the nozzle plate, the chamber body including a semiconductor substrate, a dielectric layer over the semiconductor substrate, and an epitaxial silicon growth layer over the dielectric layer;
a chamber at least partially formed by a cavity formed in the epitaxial silicon growth layer and a surface of the nozzle plate, the chamber in fluid communication with the nozzle and in fluid communication with the fluid reservoir; and
a metal layer forming a ring around the fluid chamber and a fluid tight seal between the chamber body and the nozzle plate, the metal layer coupling the chamber body to the nozzle plate.

14. The microfluidic device of claim 13 wherein:
the chamber includes a top, a bottom, and sidewalls;
the chamber top is the surface of the nozzle plate, the bottom of the chamber is a surface of the dielectric layer of the chamber body; and
at least a portion of the epitaxial forming at least a portion of the sidewalls.

15. The microfluidic device of claim 14, further comprising:
a bonding pad;
a heater; and
a trench in the chamber body that electrically isolates the boding pad from the portion of the sidewalls formed by the portion of the epitaxial forming at least the portion of the sidewalls.

16. The microfluidic device of claim 13, further comprising a heater component in the chamber body, the heater component configured to heat the fluid in the chamber to expel fluid through the nozzle.

17. The microfluidic device of claim 16, wherein the heater component is facing the nozzle.

18. The microfluidic device of claim 13 wherein the metal layer is gold.

19. A microfluidic device comprising:
a nozzle plate including a dielectric layer, a substrate layer, and a nozzle;
a chamber body, the chamber body including a semiconductor substrate, a dielectric layer over the semiconductor substrate, and a semiconductor layer over the dielectric layer;
a chamber at least partially formed in the semiconductor layer and covered by the nozzle plate, the chamber in fluid communication with the nozzle;
a fluid inlet comprising an aperture through the chamber body and in fluid communication with the chamber; and
a chamber body bonding ring formed on an upper surface of the semiconductor layer of the chamber body and a nozzle plate bonding ring formed on a lower surface of the dielectric layer of the nozzle plate, the chamber body bonding ring bonded to the nozzle plate bonding ring.

20. The microfluidic device of claim 19 wherein:
the chamber is formed by a top, a bottom, and sidewalls, the top of the chamber is formed by a surface of the dielectric layer of the nozzle plate, the bottom of the chamber is formed by a surface of the dielectric layer of the chamber body; and
at least a portion of the sidewalls include a portion of the semiconductor layer.

21. The microfluidic device of claim 19 wherein the dielectric layers of the nozzle plate and the chamber body includes silicon dioxide.

\* \* \* \* \*